United States Patent
Hou et al.

(10) Patent No.: US 8,570,182 B2
(45) Date of Patent: Oct. 29, 2013

(54) SERVER WITH VOLTAGE TEST SYSTEM

(75) Inventors: Zuo-Lin Hou, Shenzhen (CN); Song Yu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 56 days.

(21) Appl. No.: 13/442,931

(22) Filed: Apr. 10, 2012

(65) Prior Publication Data

US 2013/0207809 A1    Aug. 15, 2013

(30) Foreign Application Priority Data

Feb. 14, 2012 (CN) .......................... 2012 1 0032430

(51) Int. Cl.
G08B 21/00 (2006.01)

(52) U.S. Cl.
USPC ............ 340/661; 340/662; 340/657; 340/663

(58) Field of Classification Search
USPC .................................. 340/661, 662, 657, 663
See application file for complete search history.

(56) References Cited

U.S. PATENT DOCUMENTS

| | | | |
|---|---|---|---|
| 6,633,171 B2 * | 10/2003 | Brown et al. | 324/647 |
| 7,791,494 B2 * | 9/2010 | Chen et al. | 340/661 |
| 8,395,520 B2 * | 3/2013 | Xiong | 340/661 |
| 2008/0258927 A1 * | 10/2008 | Chen et al. | 340/661 |
| 2011/0032112 A1 * | 2/2011 | Xiong | 340/661 |

* cited by examiner

Primary Examiner — Travis Hunnings
(74) Attorney, Agent, or Firm — Altis & Wispro Law Group, Inc.

(57) ABSTRACT

A server includes a motherboard, a first test unit, and an indication device. The first test unit is connected to a first voltage terminal of the motherboard to receive a first voltage. The first test unit determines whether the received first voltage is within a range between a first predetermined voltage and a second predetermined voltage. If the first voltage is not within the range between the first predetermined voltage and the second predetermined voltage, the indication device indicates that the first voltage is abnormal.

11 Claims, 2 Drawing Sheets

US 8,570,182 B2

SERVER WITH VOLTAGE TEST SYSTEM

TECHNICAL FIELD

The present disclosure relates to servers, and particularly, to a server having a voltage test system.

DESCRIPTION OF RELATED ART

After functioning for a long period of time, the elements in a server may malfunction. For example, the voltage terminals of motherboards in the server may corrode and fail to output voltages, or voltages at the correct level, and elements on the motherboards may not work or function correctly. Therefore, it is important to determine whether the voltage terminals of the motherboards can output voltages normally and correctly.

BRIEF DESCRIPTION OF THE DRAWINGS

Many aspects of the present embodiments can be better understood with reference to the following drawings. The components in the drawing are not necessarily drawn to scale, the emphasis instead being placed upon clearly illustrating the principles of the present disclosure. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of example and not by way of limitation. It should be noted that references to "an" or "one" embodiment in this disclosure are not necessarily to the same embodiment, and such references mean at least one.

Figure 1:
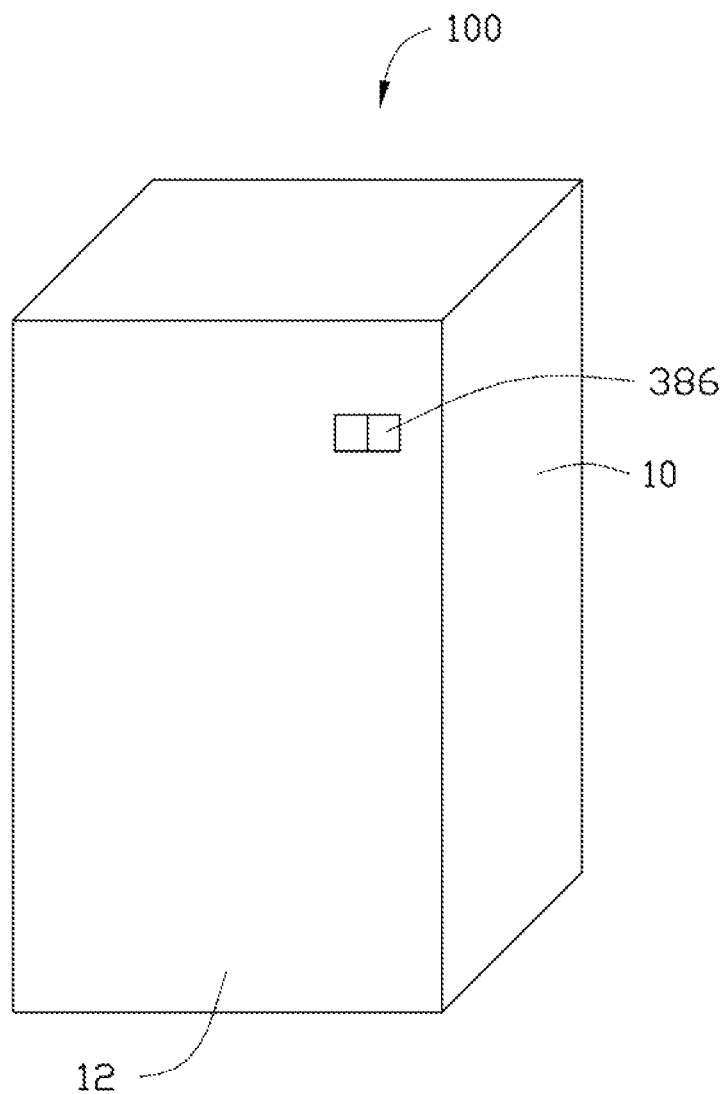
FIG. 1 is a schematic view of an exemplary embodiment of a server.
Figure 2:
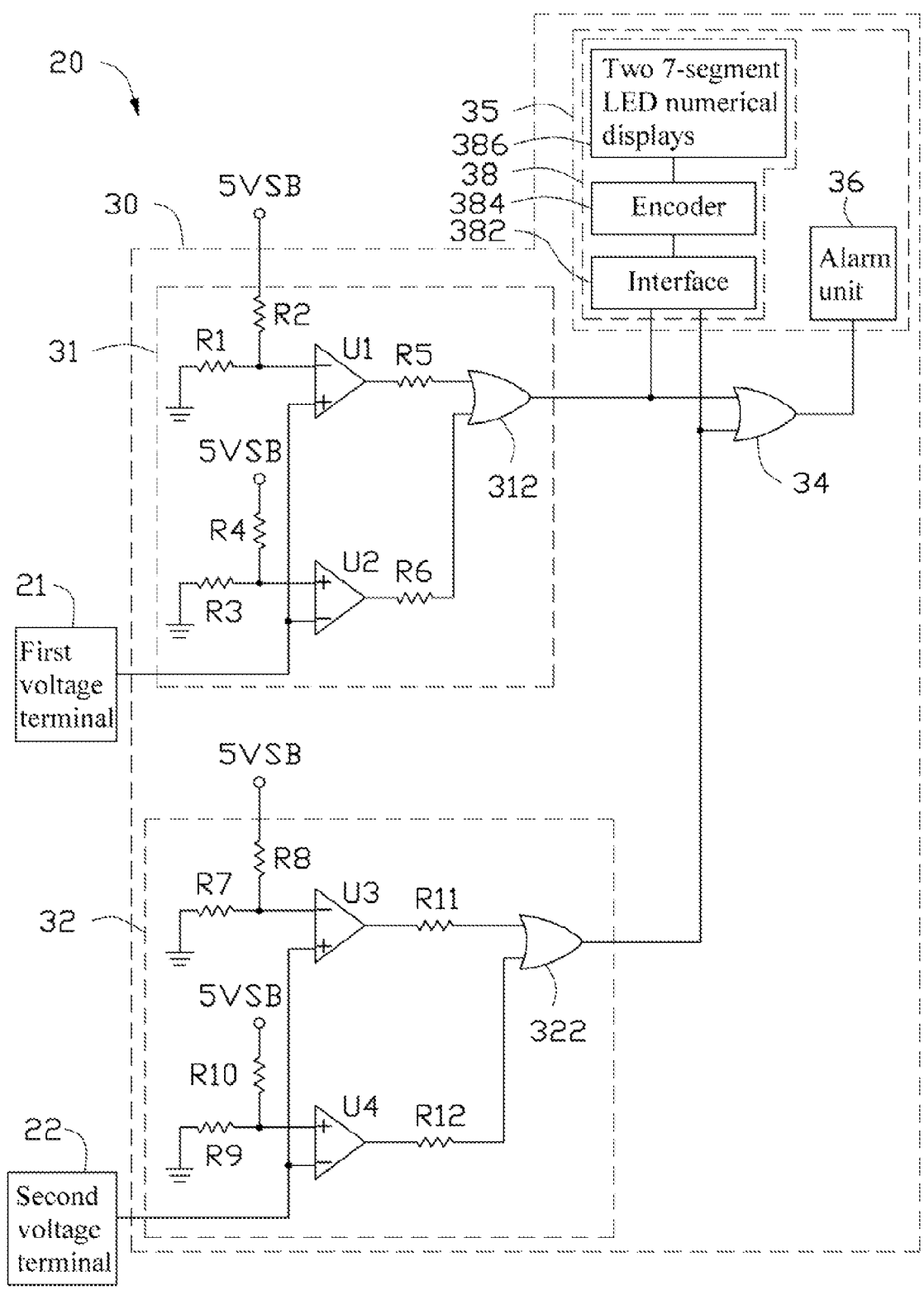
FIG. 2 is a circuit diagram of the server of FIG. 1.

Referring to FIGS. 1 and 2, an embodiment of a server 100 includes an enclosure 10, a motherboard 20 received in the enclosure 10, and a voltage test system 30.

The voltage test system 30 includes a first voltage test unit 31, a second voltage test unit 32, a digital logic gate (OR gate 34), and an indication device 35. The indication device 35 includes an alarm unit 36 and a display unit 38.

The first voltage test unit 31 is connected to a first voltage terminal 21 of the motherboard 20 to test a first voltage output by the first voltage terminal 21, and determine whether the first voltage is normal or abnormal.

The second voltage test unit 32 is connected to a second voltage terminal 22 of the motherboard 20 to test a second voltage output by the second voltage terminal 22, and determine whether the second voltage is normal or abnormal.

The first voltage test unit 31 is arranged on the motherboard 20. The first voltage test unit 31 includes a first comparator U1, a second comparator U2, resistors R1-R6, and a digital logic gate (OR gate 312). The resistors R1 and R2 are connected in series between ground and a standby voltage terminal 5VSB of the motherboard 20. The resistors R3 and R4 are connected in series between ground and the standby voltage terminal 5VSB. An inverting terminal of the first comparator U1 is connected to a node between the resistors R1 and R2. A non-inverting terminal of the first comparator U1 is connected to the first voltage terminal 21 to receive the first voltage. An output terminal of the first comparator U1 is connected to a first input terminal of the OR gate 312 through the resistor R5. A non-inverting terminal of the second comparator U2 is connected to a node between the resistors R3 and R4. An inverting terminal of the second comparator U2 is connected to the first voltage terminal 21 to receive the first voltage. An output terminal of the second comparator U2 is connected to a second input terminal of the OR gate 312 through the resistor R6.

Resistances of the resistors R1-R4 can be adjusted to make a voltage of the node between the resistors R1 and R2 equal to a first predetermined voltage, and make a voltage of the node between the resistors R3 and R4 equal to a second predetermined voltage. The first predetermined voltage is an upper limit voltage output by the first voltage terminal 21. The second predetermined voltage is a lower limit voltage output by the first voltage terminal 21.

The second voltage test unit 32 is arranged on the motherboard 20. The second voltage test unit 32 includes a third comparator U3, a fourth comparator U4, resistors R7-R12, and a digital logic gate (OR gate 322). The resistors R7 and R8 are connected in series between ground and the standby voltage terminal 5VSB. The resistors R9 and R10 are connected in series between ground and the standby voltage terminal 5VSB. An inverting terminal of the third comparator U3 is connected to a node between the resistors R7 and R8. A non-inverting terminal of the third U3 is connected to the second voltage terminal 22 of the motherboard 20 to receive a second voltage. An output terminal of the third comparator U3 is connected to a first input terminal of the OR gate 322 through the resistor R11. A non-inverting terminal of the fourth comparator U4 is connected to a node between the resistors R9 and R10. An inverting terminal of the fourth comparator U4 is connected to the second voltage terminal 22 to receive the second voltage. An output terminal of the fourth comparator U4 is connected to a second input terminal of the OR gate 322 through the resistor R12.

Resistances of the resistors R7-R10 can be adjusted to make a voltage of the node between the resistors R7 and R8 equal to a third predetermined voltage, and make a voltage of the node between the resistors R9 and R10 equal to a fourth predetermined voltage. The third predetermined voltage is an upper limit voltage output by the second voltage terminal 22. The fourth predetermined voltage is a lower limit voltage output by the second voltage terminal 22.

An output terminal of the OR gate 312 is connected to a first input terminal of the OR gate 34. An output terminal of the OR gate 322 is connected to a second input terminal of the OR gate 34. An output terminal of the OR gate 34 is connected to the alarm unit 36.

The display unit 38 includes an interface 382, an encoder 384, and two 7-segment light-emitting diode (LED) numerical displays 386. The interface 382 and the encoder 384 are mounted on the motherboard 20. The 7-segment LED numerical displays 386 are mounted on a front panel 12 of the enclosure 10. The output terminals of the OR gates 312 and 322 are both connected to the interface 382. The encoder 384 is connected to the interface 382 to receive signals from the OR gates 312 and 322, and encodes the signals into codes. The 7-segment LED numerical displays 386 is connected to the encoder 384, to receive the codes and display the codes, which can denote whether the first or/and second voltages are abnormal.

An example is taken to describe the working principle of the voltage test system 30. If the first voltage output by the first voltage terminal 21 is greater than the first upper limit voltage of the first voltage but the second voltage output by the second voltage terminal 22 is between the third predetermined voltage and the fourth predetermined voltage, the output terminal of the first comparator U1 outputs a high level signal to the first input terminal of the OR gate 312, and the output terminal of the second comparator U2 outputs a low level signal to the second input terminal of the OR gate 312. The output terminal of the OR gate 312 outputs a high level signal to corresponding pins of the interface 382 and the first input terminal of the OR gate 34. If the first voltage is lower than the first lower limit voltage of the first voltage, the output terminal of the first comparator U1 outputs a low level signal to the first input terminal of the OR gate 312, and the output terminal of the second comparator U2 outputs a high level signal to the second input terminal of the OR gate 312. The output terminal of the OR gate 312 outputs a high level signal to the corresponding pins of the interface 382 and the first input terminal of the OR gate 34. Briefly, when the first voltage output by the first voltage terminal 21 is abnormal, that is the first voltage output by the first voltage terminal 21 is greater than the upper limit voltage or lower than the lower limit voltage, the output terminal of the OR gate 312 outputs a high level signal to the corresponding pins of the interface 382 and the first input terminal of the OR gate 34.

When the second voltage output by the second voltage terminal 22 is between the first and second predetermined voltages, the output terminal of the third comparator U3 outputs a low level signal to the first input terminal of the OR gate 322, and the output terminal of the fourth comparator U4 outputs a low level signal to the second input terminal of the OR gate 322. The output terminal of the OR gate 322 outputs a low level signal to the corresponding pins of the interface 382 and the second input terminal of the OR gate 34.

The output terminal of the OR gate 34 outputs a high level signal to the alarm unit 36. The alarm unit 36 is activated. The encoder 384 receives the signals from the interface 382 and encodes the signals into a first code, and outputs the first code to the 7-segment LED numerical displays 386. The 7-segment LED numerical displays 386 displays the first code to denote that the first voltage output by the first voltage terminal 21 is abnormal.

Similarly, if the second voltage output by the second voltage terminal 22 is abnormal, while the first voltage output by the first voltage terminal 21 is normal, the output terminal of the OR 322 outputs a high level signal to the corresponding pins of the interface 382 and the second input terminal of the OR 34. The encoder 384 receives the signals from the interface 382 and encodes the signals into a second code, and outputs the second code to the 7-segment LED numerical displays 386. The 7-segment LED numerical displays 384 display the second code to denote that the second voltage output by the second voltage terminal 22 is abnormal. If the first voltage output by the first voltage terminal 21 and the second voltage output by the second voltage terminal 22 are both abnormal, the OR gate 312 outputs a high level signal to the corresponding pins of the interface 382 and the first terminal of the OR gate 34. The OR gate 322 outputs a high level signal to the corresponding pins of the interface 382 and the second input terminal of the OR gate 34. The 7-segment LED numerical displays 384 display a third code encoded by the encoder 384 to denote that both the first and second voltages are abnormal.

In the embodiment, the alarm unit 36 is a loudspeaker. In other embodiments, the alarm unit 36 can be an LED. The number of the voltage test units can be adjusted according to the number of the voltage terminals of the motherboard 20.

Although numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A voltage test system for a motherboard, the voltage test system comprising:
    a first comparator comprising an inverting terminal to receive a first predetermined voltage, a non-inverting terminal connected to a first voltage terminal of the motherboard to receive a first voltage, and an output terminal, wherein the first comparator compares the first predetermined voltage with the first voltage, and outputs a first comparison signal;
    a second comparator comprising a non-inverting terminal to receive a second predetermined voltage, an inverting terminal connected to the first voltage terminal to receive the first voltage, and an output terminal, wherein the second comparator compares the second predetermined voltage with the first voltage, and outputs a second comparison signal;
    a first OR gate comprising a first input terminal connected to the output terminal of the first comparator to receive the first comparison signal, a second input terminal connected to the output terminal of the second comparator to receive the second comparison signal, and an output terminal; and
    an indication device connected to the output terminal of the first OR gate;
    wherein when the first voltage is not within a range between the first and second predetermined voltages, the first OR gate outputs a first control signal to start the indication device to denote that the first voltage is abnormal.

2. The voltage test system of claim 1, further comprising a third comparator, a fourth comparator, and a second OR gate, wherein an inverting terminal of the third comparator receives a third predetermined voltage, a non-inverting terminal of the third comparator is connected to a second voltage terminal of the motherboard to receive a second voltage, an output terminal of the third comparator is connected to a first input terminal of the second OR gate, the third comparator compares the second voltage with the third predetermined voltage, and outputs a third comparison signal to the first input terminal of the second OR gate, a non-inverting terminal of the fourth comparator receives a fourth predetermined voltage, an inverting terminal of the fourth comparator is connected to the second voltage terminal to receive the second voltage, an output terminal of the fourth comparator is connected to a second input terminal of the second OR gate, the fourth comparator compares the second voltage with the fourth predetermined voltage, and outputs a fourth comparison signal to the second input terminal of the second OR gate, an output terminal of the second OR gate is connected to the indication device, when the second voltage is not within a range between the third and fourth predetermined voltages, the second OR gate outputs a second control signal to start the indication device to denote that the second voltage is abnormal.

3. The voltage test system of claim 2, wherein the indication device comprises an interface, an encoder, and two light emitting diode (LED) numerical displays, the interface is connected to the output terminals of the first and second OR gates to receive the first and second control signals, the encoder is connected to the interface to receive the first and second control signals, the encoder is also connected to the LED numerical displays, when the encoder only receives the first control signal, the encoder encodes the first control signal into a first code, and outputs the first code to the LED numerical displays to make the LED numerical displays display the first code, thereby denoting the first voltage is abnormal, when the encoder only receives the second control signal, the encoder encodes the second control signal into a second code, and outputs the second code to the LED numerical displays to make the LED numerical displays display the second code, thereby denoting the second voltage is abnormal, when the encoder receives the first and second control signals, the encoder encodes the first and second signals into a third code, and outputs the third code to the LED numerical displays to make the LED numerical displays display the third code, thereby denoting the first and second voltage are abnormal.

4. The voltage test system of claim 3, further comprising a third OR gate, wherein the indication device further comprises an alarm unit, a first input terminal of the third OR gate is connected to the output terminal of the first OR gate to receive the first control signal, a second input terminal of the third OR gate is connected to the output terminal of the second OR gate to receive the second control signal, an output terminal of the third OR gate is connected to the alarm unit, when the third OR gate receives at least one of the first and second control signals, the third OR gate starts the alarm unit to denote that at least one of the first and second voltages is abnormal.

5. The voltage test system of claim 2, further comprising first to eighth resistors, wherein the first and second resistors are connected between a standby voltage terminal of the motherboard and ground in series, a node between the first and second resistors is connected to the inverting terminal of the first comparator to output the first predetermined voltage, the third and fourth resistors are connected between the standby voltage terminal and ground in series, a node between the third and fourth resistors is connected to the non-inverting terminal of the second comparator to output the second predetermined voltage, the fifth and sixth resistors are connected between the standby voltage terminal and ground in series, a node between the fifth and six resistors is connected to the inverting terminal of the third comparator to output the third predetermined voltage, the seventh and eighth resistors are connected between the standby voltage terminal and ground in series, a node between the seventh and eighth resistors is connected to the non-inverting terminal of the fourth comparator to output the fourth predetermined voltage.

6. A server, comprising:
a motherboard comprising a first voltage terminal to output a first voltage;
a first voltage test unit comprising:
a first comparator comprising an inverting terminal to receive a first predetermined voltage, a non-inverting terminal connected to the first voltage terminal to receive the first voltage, and an output terminal, wherein the first comparator compares the first predetermined voltage with the first voltage, and outputs a first comparison signal;
a second comparator comprising a non-inverting terminal to receive a second predetermined voltage, an inverting terminal connected to the first voltage terminal to receive the first voltage, and an output terminal, wherein the second comparator compares the second predetermined voltage with the first voltage, and outputs a second comparison signal; and
a first OR gate comprising a first input terminal connected to the output terminal of the first comparator to receive the first compassion signal, a second input terminal connected to the output terminal of the second comparator to receive the second comparison signal, and an output terminal; and
an indication device connected to the output terminal of the first OR gate;
wherein when the first voltage is not within a range between the first and second predetermined voltages, the first OR gate outputs a first control signal to start the indication device to denote that the first voltage is abnormal.

7. The server of claim 6, further comprising a second voltage test unit, wherein the motherboard further comprises a second voltage terminal to output a second voltage, the second voltage test unit comprises a third comparator, a fourth comparator, and a second OR gate, an inverting terminal of the third comparator receives a third predetermined voltage, a non-inverting terminal of the third comparator is connected to the second voltage terminal of the motherboard to receive the second voltage, an output terminal of the third comparator is connected to a first input terminal of the second OR gate, the third comparator compares the second voltage with the third predetermined voltage, and outputs a third comparison signal to the first input terminal of the second OR gate, a non-inverting terminal of the fourth comparator receives a fourth predetermined voltage, an inverting terminal of the fourth comparator is connected to the second voltage terminal to receive the second voltage, an output terminal of the fourth comparator is connected to a second input terminal of the second OR gate, the fourth comparator compares the second voltage with the fourth predetermined voltage, and outputs a fourth comparison signal to the second input terminal of the second OR gate, an output terminal of the second OR gate is connected to the indication device, when the second voltage is not within a range between the third and fourth predetermined voltages, the second OR gate outputs a second control signal to start the indication device to denote that the second voltage is abnormal.

8. The server of claim 7, wherein the motherboard further comprises a standby voltage terminal, the first voltage test unit further comprises first to fourth resistors, the second voltage test unit further comprises fifth to eighth resistors, the first and second resistors are connected in series between the standby voltage terminal and ground, a node between the first and second resistors is connected to the inverting terminal of the first comparator to output the first predetermined voltage, the third and fourth resistors are connected in series between the standby voltage terminal and ground, a node between the third and fourth resistors is connected to the non-inverting terminal of the second comparator to output the second predetermined voltage, the fifth and sixth resistors are connected in series between the standby voltage terminal and ground, a node between the fifth and six resistors is connected to the inverting terminal of the third comparator to output the third predetermined voltage, the seventh and eighth resistors are connected in series between the standby voltage terminal and ground, a node between the seventh and eighth resistors is connected to the non-inverting terminal of the fourth comparator to output the fourth predetermined voltage.

9. The server of claim 7, wherein the indication device comprises an interface, an encoder, and two light emitting diode (LED) numerical displays, the interface is connected to the output terminals of the first and second OR gates to receive the first and second control signals, the encoder is connected to the interface to receive the first and second control signals, the encoder is connected to the LED numerical displays, when the encoder only receives the first control signal, the encoder encodes the first control signal into a first code, and outputs the first code to the LED numerical displays to make the LED numerical displays display the first code to denote the first voltage is abnormal, when the encoder only receives the second control signal, the encoder encodes the second control signal into a second code, and outputs the second code to the LED numerical displays to make the LED numerical displays display the second code to denote the second voltage is abnormal, when the encoder receives the first and second control signals, the encoder encodes the first and second signals into a third code, and outputs the third code to the LED numerical displays to make the LED numerical displays display the third code to denote the first and second voltage are both abnormal.

10. The server of claim 9, further comprising a third OR gate, wherein the indication device further comprises an alarm unit, a first input terminal of the third OR gate is connected to the output terminal of the first OR gate to receive the first control signal, a second input terminal of the third OR gate is connected to the output terminal of the second OR gate to receive the second control signal, an output terminal of the third OR gate is connected to the alarm unit, when the third OR gate receives at least one of the first and second control signals, the third OR gate starts the alarm unit to denote at least one of the first and second voltages is abnormal.

11. The server of claim 9, further comprising an enclosure, wherein the motherboard, and the first and second voltage test units are arranged in the enclosure, the LED numerical displays are mounted on a front panel of the enclosure.

* * * * *